United States Patent

Nagoya et al.

[11] Patent Number: 5,685,905
[45] Date of Patent: Nov. 11, 1997

[54] METHOD OF MANUFACTURING A SINGLE CRYSTAL THIN FILM

[75] Inventors: Takatoshi Nagoya; Hisashi Kashino, both of Annaka; Hitoshi Habuka, Maebashi, all of Japan

[73] Assignee: Shin-Etsu Handotai, Co., Ltd., Tokyo, Japan

[21] Appl. No.: 612,393

[22] Filed: Mar. 7, 1996

[30] Foreign Application Priority Data

Mar. 10, 1995 [JP] Japan .................................. 7-079453

[51] Int. Cl.⁶ ............................................. C30B 25/16
[52] U.S. Cl. ........................... 117/98; 117/89; 117/107
[58] Field of Search .................................. 117/84, 85, 86, 117/89, 95, 108, 98, 106; 437/103, 108

[56] References Cited

U.S. PATENT DOCUMENTS

| | | | |
|---|---|---|---|
| 4,147,571 | 4/1979 | Stringfellow et al. | 117/89 |
| 4,719,124 | 1/1988 | Lu et al. | 117/104 |
| 5,456,205 | 10/1995 | Sheldon | 117/108 |
| 5,505,159 | 4/1996 | Mochizuki et al. | 117/89 |

FOREIGN PATENT DOCUMENTS

| | | | |
|---|---|---|---|
| 1037766 | 8/1966 | United Kingdom | 117/89 |

*Primary Examiner*—Felisa Garrett
*Attorney, Agent, or Firm*—Ronald R. Snider

[57] ABSTRACT

In the preparation stage before the manufacturing of the single crystal thin film 13, growth conditions are determined by conducting a vapor phase growth without rotating the rotatable holder 14 on its axis and making adjustments such that the growth rate of the single crystal thin film 13 is laterally asymmetric with respect to the virtual center axis on the holder 14 parallel to the feeding direction of the source material gas 19, and then said single crystal thin film is manufactured based on said growth conditions.

3 Claims, 5 Drawing Sheets

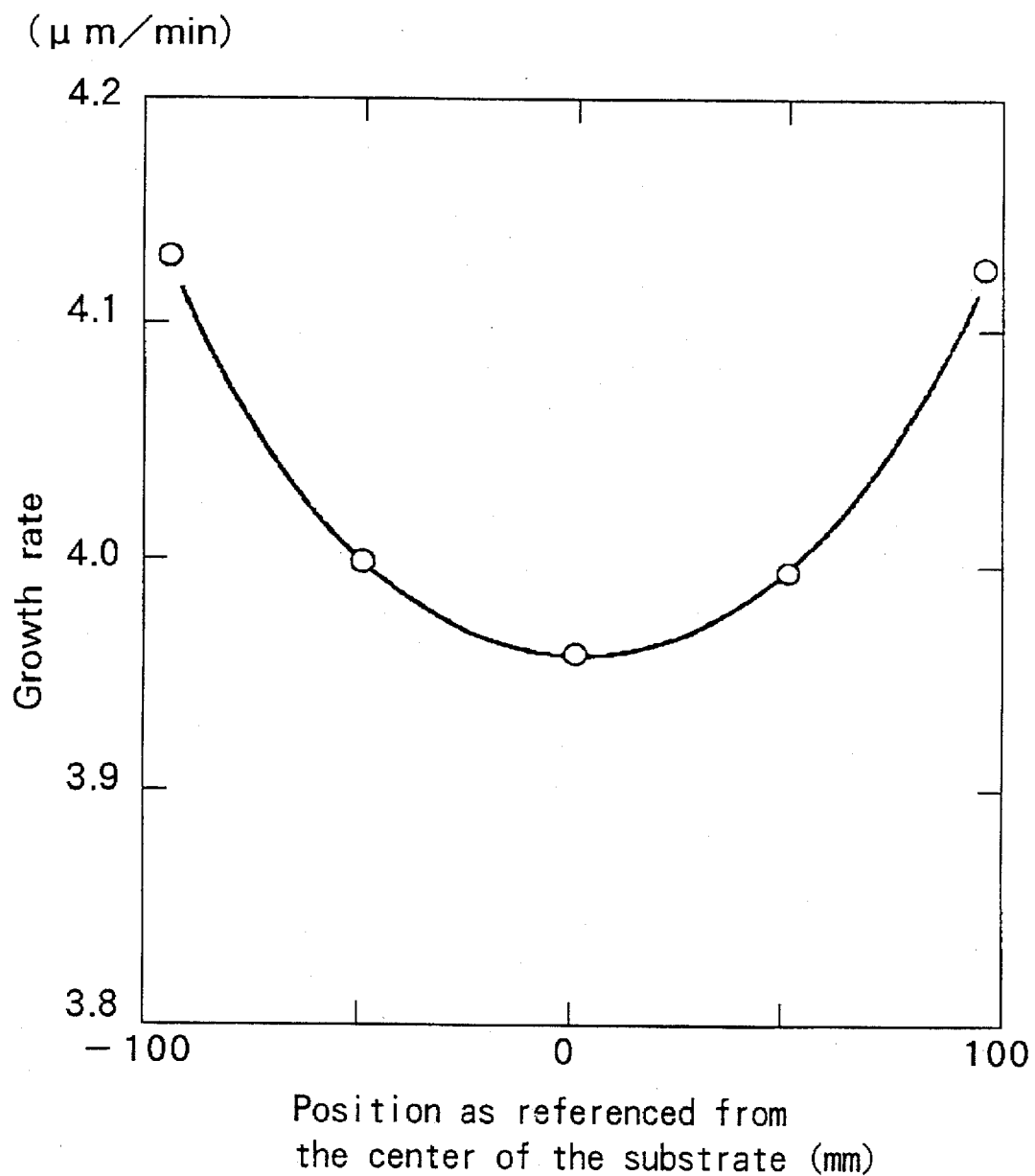
F I G. 3

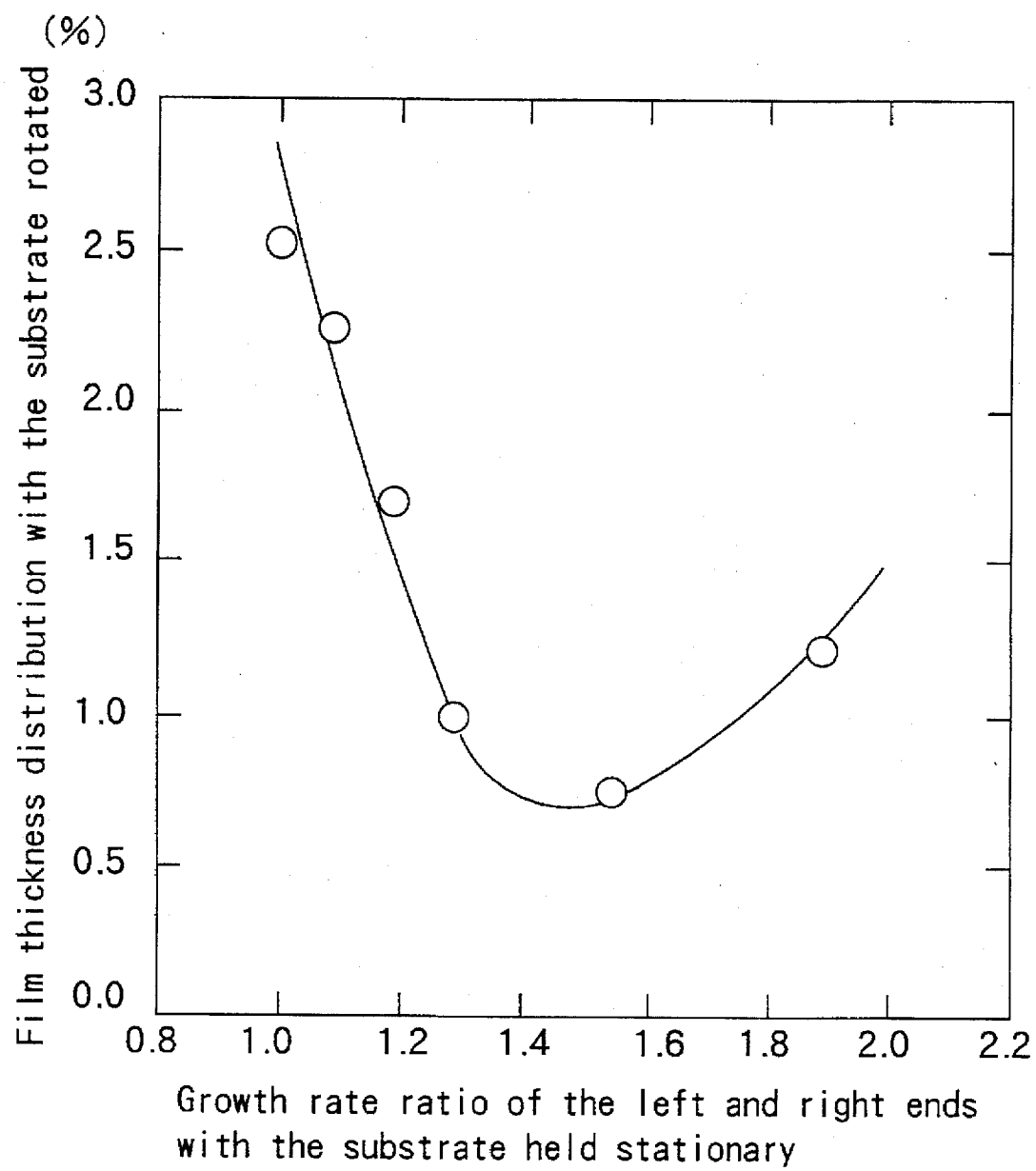
F I G. 5

METHOD OF MANUFACTURING A SINGLE CRYSTAL THIN FILM

RELATED APPLICATION

This application claims the priority of Japanese Patent application No. 7-79453 filed on Mar. 10, 1995, which are incorporeted herein by reference.

BACKGROUND OF THE INVENTION

1. Field of the Invention

This invention relates in general to a method of manufacturing a single crystal thin film with a uniform thickness.

2. The Prior Art

It is well known that, when conducting a vapor phase growth of a single crystal thin film by feeding the source material gas from a horizontal direction onto a semiconductor single crystal substrate horizontally placed in a horizontal-type vapor phase growth apparatus, the single crystal thin film becomes thicker on the upstream side of the source material gas flow unless said semiconductor single crystal substrate rotates. Because of this, said semiconductor single crystal substrate is rotated to average the thickness distribution of the single crystal thin film at the upstream side and at the downstream side of the source material gas flow.

Usually, test growth of the single crystal thin film is conducted repeatedly with different settings of the concentration, flow rates and such of said source material gas and the dopant gas until the thickness and the resistivity of said single crystal thin film achieve the desired values before manufacturing a single crystal thin film for the purpose of determining the settings of the concentration, flow rate and such of the source material gas and the dopant gas. Hereafter, the stage in which the test growth is conducted is called the preparation stage.

In said preparation stage, as shown in FIG. 1 and FIG. 2, the source material gas 19 is fed through the inlet ports 16 to the semiconductor single crystal substrate 12 placed on the holder 14 which is rotating on its own axis in the reactor vessel 17 of the vapor phase growth apparatus 10 and heated to the desired temperature with the heating means 15 so as to conduct a vapor phase growth of the single crystal thin film 13 on the semiconductor single crystal substrate 12, in the same manner as when manufacturing products. In addition to the adjustment to obtain the desired values of the thickness and resistivity of the single crystal thin film 13, it is also conducted to adjust to make sure their distribution falls within the range specified in the control standard.

In recent years, due to the miniaturization of electronic device processes and enlargement of the diameter of semiconductor single crystal substrates, the thickness distribution of single crystal thin films is required to be smaller than ever. Recently, 1% or less of film thickness unevenness, as defined by equation (1), has been required.

(Maximum thickness−Minimum thickness)/(Maximum thickness+ Minimum thickness)×100 (%)   (1)

However, for adjustment of the film thickness distribution, the settings of the concentration, flow rate and such of the source material gas are still adjusted in a trial-and-error fashion based on intuition and experience in the preparation stage, requiring a long preparation time and a large testing cost.

BRIEF SUMMARY OF THE INVENTION

The object of this invention is to provides a method of manufacturing a single crystal thin film which can easily achieve a uniform film thickness distribution without depending on intuition and experience.

This invention provides a method of manufacturing a single crystal thin film which comprises vapor phase growth of a single crystal thin film on a semiconductor single crystal substrate placed on a holder for rotating on its own axis in a reactor vessel by feeding the source material gas to said semiconductor single crystal substrate, wherein growth conditions are determined by conducting a vapor phase growth of a single crystal thin film on said semiconductor single crystal substrate without rotating said holder on its axis in the preparation stage before the manufacturing of said single crystal thin film, and then said single crystal thin film is manufactured based on said growth conditions.

BRIEF DESCRIPTION OF THE DRAWINGS

FIG. 3 is a figure showing the measurements of the growth rate at various points on a semiconductor single crystal substrate when the vapor phase growth is conducted with a conventional method while the semiconductor single crystal substrate is held stationary, FIG. 5 is a graph showing relationship between the growth rate ratio of the left and right ends with the semiconductor single crystal substrate held stationary and the film thickness distribution with the semiconductor single crystal substrate rotated.

DETAILED DESCRIPTION

Figure 1:
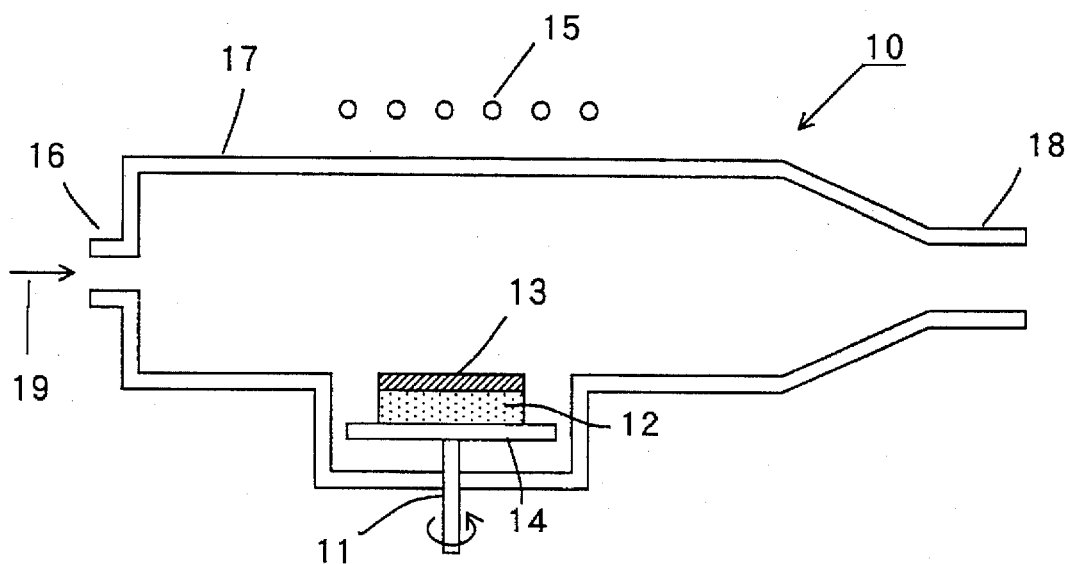
FIG. 1 is an explanatory cross section of the horizontal type vapor phase growth apparatus used to demonstrate the method of manufacturing a single crystal thin film pertaining to Example 1 of the present invention.

The present invention is further described in details below.

This invention provides a method of manufacturing a single crystal thin film which comprises vapor phase growth of a single crystal thin film on a semiconductor single crystal substrate placed on a holder for rotating on its own axis in a reactor vessel by feeding the source material gas to said semiconductor single crystal substrate wherein, in the preparation stage before the manufacturing of said single crystal thin film, growth conditions are determined by conducting a vapor phase growth of a single crystal thin film on said semiconductor single crystal substrate without rotating said holder on its axis and then said single crystal thin film is manufactured based on said growth conditions.

In said preparation stage, the growth rate of the single crystal thin film should preferably be adjusted to be laterally asymmetric with respect to the virtual center axis on said holder parallel to the direction in which the source material gas is fed. Also, two growth rate measurements of said single crystal thin film taken at the right and left ends of the semiconductor crystal substrate with respect to said center axis should preferably be such that one of the growth rates is 1.3–1.8 times greater than the other.

According to this invention, in the preparation stage before manufacturing the single crystal thin film, the vapor phase growth of the single crystal thin film is conducted on the semiconductor single crystal substrate which is held still by not allowing the holder to rotate on its own axis, and therefore the conditions of the vapor phase growth are directly reflected in the film thickness distribution of the single crystal thin film without being averaged, thus it becomes easier to determine the necessary changes in the settings for the next adjustment.

Conventionally, attempts were made to make the temperature distribution and the source material gas feeding rate uniform along the direction perpendicular to the feeding direction of said source material gas so as to make the film thickness distribution of the single crystal thin film uniform. However, the vapor phase growth apparatus 10 shown in FIG. 1 and FIG. 2 was used to conduct the vapor phase growth of the single crystal thin film 13 with the semiconductor single crystal substrate 12 stationary and the distribution of the growth rate along the width-wise direction of the reaction vessel 17, i.e. the direction perpendicular to the virtual center axis A parallel to the feeding direction of the source material gas 9, was investigated and it was discovered that, as shown in FIG. 3, the growth rate became larger in the peripheral areas of the semiconductor single crystal substrate 12, i.e. the areas closer to the side wall of the reaction vessel 17. When the growth rate distribution was as shown in FIG. 3, the film thickness distribution obtained by rotating the semiconductor single crystal substrate 12 was 2.6%, as calculated using the aforementioned equation (1).

When the vapor phase growth is conducted while the holder 14 rotates on the rotation axis 11 with which the holder 14 is symmetric, the thickness of the single crystal thin film 13 grown on the semiconductor single crystal substrate 12 placed on said holder 14 is obtained by adding up or integrating the growth rate at each point in the path of said semiconductor single crystal substrate 12 with respect to time.

The rotation of the semiconductor single crystal substrate 12 mentioned here means that the semiconductor single crystal substrate 12 placed on the holder 14 for rotating on its own axis rotates along with said holder 14. In the single-wafer type growth apparatus, it means it rotates on the same axis as the holder's rotating axis 11. In the multi-wafer growth using the batch type growth apparatus, it means it orbits around the same axis as the holder's rotating axis 11.

That is, if the vapor phase growth is conducted with the semiconductor single crystal substrate 12 being rotated while the temperature distribution created by the heating means 15 and the supply rate of the source material gas 19 are made uniform along the direction perpendicular to said center axis, then the film thickness on the circumference portion of said holder 14 inevitably becomes thicker than on the center portion, making it impossible to make the film thickness distribution of the single crystal thin film 13 uniform.

To solve this problem, the temperature distribution created by the heating means 15 and/or the supply rate of the source material gas 19 are adjusted in said preparation stage such that the growth rate of the single crystal thin film 13 grown with the semiconductor single crystal substrate 12 being stationary becomes laterally asymmetric with respect to the virtual center axis A on the holder 14 parallel to the feeding direction of said source material gas 19.

When the single crystal thin film 13 is grown under these conditions with the semiconductor single crystal substrate 12 being rotated, each point on the semiconductor single crystal substrate 12 repeatedly goes through areas with a large growth rate and areas with a small growth rate, so that the growth of the single crystal thin film 13 proceeds as large and small growth rates offset each other. As a result, a very uniform film thickness distribution from the center to the circumference of the semiconductor single crystal substrate 12 can be obtained.

According to the present invention, the vapor phase growth of a single crystal thin film is conducted on a semiconductor single crystal substrate with the holder held stationary in the preparation stage before manufacturing a single crystal thin film, and therefore the vapor phase growth conditions are directly, without being averaged, reflected in the film thickness distribution of the single crystal thin film, making it possible to easily manufacture the single crystal thin film with a uniform film thickness distribution without depending on intuition and experience.

Also, if the growth rate distribution on the semiconductor single crystal substrate is made asymmetric along the direction perpendicular to the feeding direction of the source material gas in said preparation stage, then large and small growth rates offset each other when said semiconductor single crystal substrate is rotated and a very uniform single crystal film thickness can be achieved.

EXAMPLES

Examples of the method of manufacturing the single crystal thin film of the present invention are described below based on FIGS. 1–7.

Example 1

Figure 2:
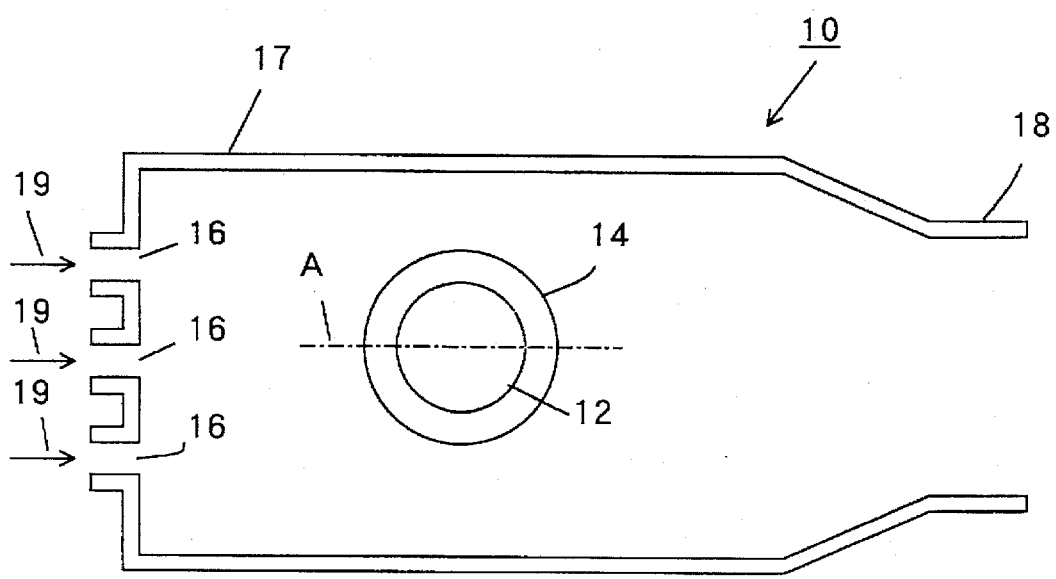
FIG. 2 is an explanatory top view of the horizontal type vapor phase growth apparatus used to demonstrate the method of manufacturing a single crystal thin film pertaining to Example 1 of the present invention.

FIG. 1 and FIG. 2 are an explanatory cross section and an explanatory top view, respectively, of the horizontal type vapor phase growth apparatus used to demonstrate the method of manufacturing a single crystal thin film pertaining to Example 1 of the present invention. Said horizontal type vapor phase growth apparatus 10 is a single-wafer type which has a transparent quartz glass reaction vessel 17, installed horizontally, with inlet ports 16 for the source material gas 19 and an exhaust port 18, a heating means 15 placed around said reaction vessel 17 for heating the semiconductor single crystal substrate 12, a cooling means, not shown, which cools said heating means 15 and the outer wall of said reaction vessel 17 and a holder 14 for said semiconductor single crystal substrate 12.

Said holder 14 is made of graphite coated with silicon carbide, and placed symmetrically with respect to the rotation axis 11 of the rotation drive. It can horizontally hold the semiconductor single crystal substrate 12 (a silicon single crystal substrate, for example; hereafter referred to as "silicon substrate 12") inserted in said reaction vessel 17 and rotate on its own axis.

First, in the preparation stage before the manufacturing of the semiconductor single crystal thin film 13 (a silicon single crystal thin film, for example; hereafter referred to as "silicon thin film 13"), the vapor phase growth conditions were adjusted by conducting the vapor phase growth of the silicon thin film 13 on said silicon substrate 12 with said holder 14 held stationary.

The silicon substrate 12 with a diameter of 200 mm was inserted into the reactor vessel 17 and placed on said holder 14 such that it had the same axis as the rotation axis 11 of said holder 14. In said reactor vessel 17, a radiation heating lamp was used for the heating means 19 and said silicon substrate 12 was heated to the reaction temperature of 1,125° C. While hydrogen, for the carrier gas, was fed at a rate of 100 liters/minute, trichlorosilane, the source material gas, was fed horizontally at a rate of 22 g/minute from the inlet ports 16 toward the exhaust port 18 to grow the silicon thin film 13 for 1 minute.

When doing this, in order to make the growth rate of the silicon thin film 13 laterally asymmetric with respect to the virtual center axis A on said holder 14, the flow rate distribution along the width-wise direction of the reaction vessel 17, i.e. the direction perpendicular to said center axis A, was adjusted such that the source material gas flow rate on the left side if facing to the exhaust port 18 would be approximately twice of the flow rate on the right side, and then the vapor phase growth was conducted.

Figure 4:
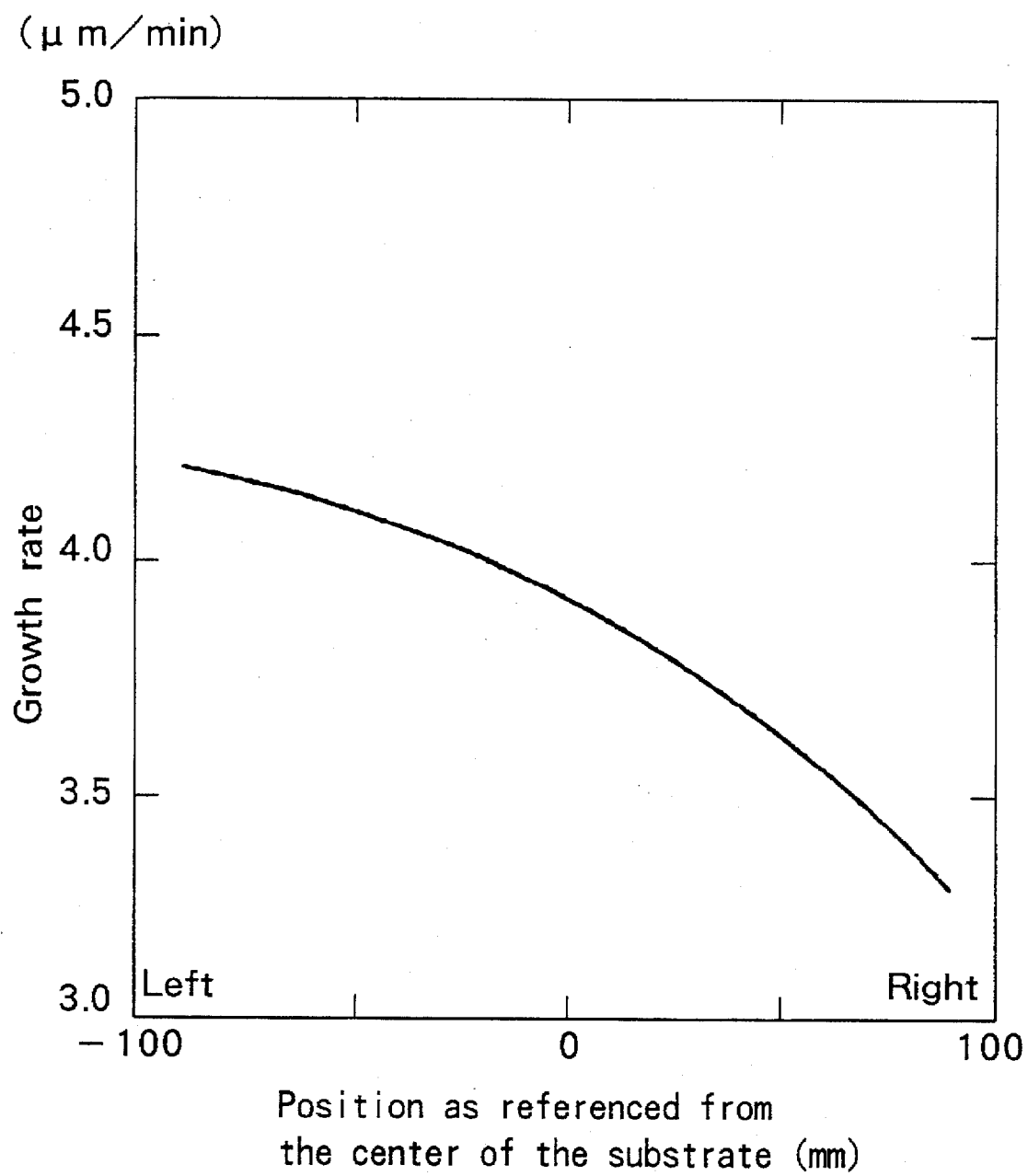
FIG. 4 is a graph showing the measurements of the growth rate at various points on a semiconductor single crystal substrate when the vapor phase growth is conducted with a method pertaining to the present invention while the semiconductor single crystal substrate is held stationary.

As a result, when the growth rates on the left and right ends were determined by taking measurements at points 10 mm inside of the left and right ends of the silicon substrate 12 with respect to said center axis A, the growth rates were, as shown in FIG. 4, 4.2 μm/minute on the left end and 3.3 μm/minute on the right end. The growth rate ratio of the left and right ends (hereafter referred to as the "growth rate ratio"), obtained by dividing the larger growth rate value by the smaller, was 1.3.

Under these vapor phase growth conditions, said holder 14 was rotated on its own axis at 35 r.p.m. and the vapor phase growth of the silicon thin film 13 was conducted. The resulting film thickness distribution, calculated by using the aforementioned equation (1), was 1.0%.

Similar testing was conducted by adjusting the flow rate distribution along the width-wise direction of the reaction vessel 17 with a supply rate of hydrogen, the carrier gas, in the range of 40–100 liters/minute and a supply rate of trichlorosilane, the source material gas, in the range of 5–22 g/minute. The relationship between the growth rate ratio with the silicon substrate 12 held stationary and the film thickness distribution with the silicon substrate 12 rotated was experimentally determined and the results are shown in FIG. 5.

As shown in FIG. 5, the film thickness distribution with the silicon substrate rotated becomes smaller as the growth rate ratio increases. When the growth rate ratio exceeds approximately 1.1, the film thickness distribution becomes 2% or less, and when it exceeds 1.3 the film thickness distribution becomes 1% or less. However, when the growth rate ratio is increased further, the film thickness distribution passes its minimum at a growth rate ratio of approximately 1.5 and then the film thickness distribution deteriorates, exceeding 1% again with a growth rate ratio over 1.8.

Example 2

Figure 6:
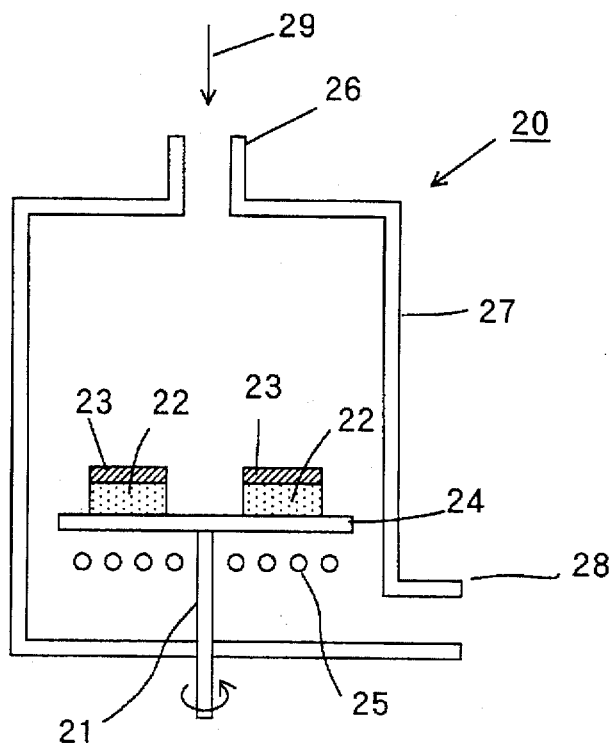
FIG. 6 is an explanatory cross section of the vertical type vapor phase growth apparatus used to demonstrate the method of manufacturing a single crystal thin film pertaining to Example 2 of the present invention.
Figure 7:
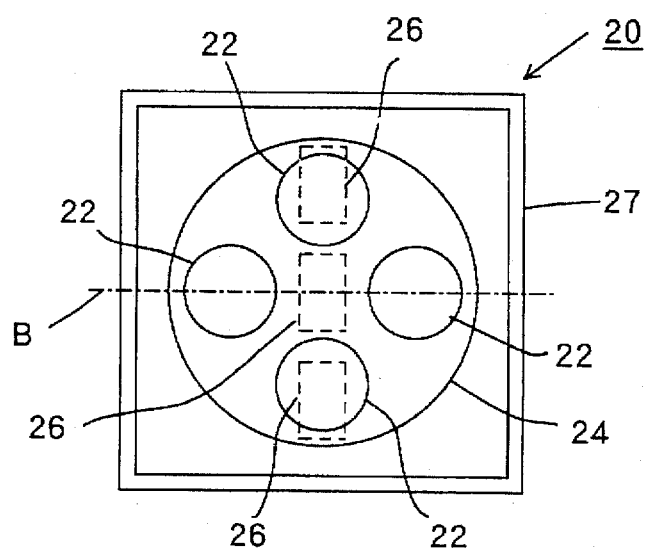
FIG. 7 is an explanatory top view of the vertical type vapor phase growth apparatus used to demonstrate the method of manufacturing a single crystal thin film pertaining to Example 2 of the present invention.

FIG. 6 and FIG. 7 are an explanatory cross section and an explanatory top view, respectively, of the vertical type vapor phase growth apparatus used to demonstrate the method of manufacturing a single crystal thin film pertaining to Example 2 of the present invention. Said vertical type vapor phase growth apparatus 20 is a batch type which has a quartz glass reaction vessel 27 with inlet ports 26 for the source material gas 29, an exhaust port 28, a holder 24 for a silicon substrate(s) 22, and a heating means 25 placed below said holder 24 for heating said silicon substrate Said holder 24 is made of graphite coated with silicon carbide, and placed symmetrically with respect to the rotation axis 21 of the rotation drive. It can horizontally hold a plurality of the silicon substrates 22 in said reaction vessel 27 and rotate on its own axis.

First, the vapor phase growth conditions were adjusted by conducting the vapor phase growth of the silicon thin film 23 on the silicon substrate 22 with said holder 24 held stationary. As shown in FIG. 6 and FIG. 7, four silicon substrates 22 with a diameter of 125 mm were placed on said holder 24 in the reaction vessel 27. A radiation lamp was used for the heating means 25 and said holder 24 was uniformly heated to indirectly heat said silicon substrate 22 to the reaction temperature of around 925° C.

While hydrogen, for the carrier gas, was fed into said reactor vessel 27 at a rate of 100 liters/minute, trichlorosilane, the source material gas, was fed vertically at a rate of 22 g/minute from the inlet ports 26, arranged in series, to said silicon substrate 22, as shown in FIG. 7, to grow the silicon thin film 23 for 10 minutes.

The source material gas 29 was vertically fed from the inlet ports 26 located on a top part of said reaction vessel to the silicon substrates 22 horizontally placed on the holder 24 and, right above the holder 24, it flowed away in the direction perpendicular to the direction in which the inlet ports 26 are lined up in series. Because of this, the film thickness distribution of the silicon thin film 23 on said holder 24 had a tendency to be thicker on the center area and thinner on the peripheral area.

Considering this tendency, the temperature distribution on said holder 24 was adjusted such that the growth rate of the silicon thin film 23 would be laterally asymmetric with respect to the virtual center axis B on said holder 24 which is perpendicular to the direction in which said inlet ports 26 were lined up, i.e. parallel with the feeding direction of the source material gas. That is, the temperature of the area near said center axis B of the holder 24 was adjusted to be 925° C., the temperature of the area on the right side, when regarding said holder 24 from said inlet ports 26, of said center axis B was adjusted to be approximately 940° C. and the temperature of the area on the left side of said center axis B was adjusted to be approximately 910° C.

Under the aforementioned reaction conditions, the vapor phase growth was conducted with said holder 24 held stationary, and the growth rate distribution of the silicon thin film 23 on said holder 24 was measured. As a result, the growth rate was approximately 0.9 micrometers/minute on the right end with respect to said center axis B and approximately 0.6 micrometers/minute on the left end, giving a lateral growth rate ratio of 1.5. Under these vapor phase growth conditions, said holder 24 was rotated on its own axis at 35 turns/minutes and the vapor phase growth was conducted for 10 minutes to form the silicon thin film 23 with a film thickness of approximately 8 μm. The film thickness distribution, calculated by using the aforementioned equation (1), was 0.8%.

Similar testing was further conducted and as a result the film thickness distribution similarly became 1% or less when the growth rate ratio of the left and right ends became 1.3 or more, and the film thickness distribution when said holder 24 was rotated was further reduced as the growth rate ratio of the left and right ends increased. However, when the temperature of the left side, when facing to the silicon substrate 22, of said center axis B was reduced even further to increase the growth rate ratio of the left and right ends, unevenness called "microroughness" appeared to develop on the surface of the silicon thin film 23 when the growth rate ratio of the left and right ends became 2.0 or more.

What is claimed is:

1. A method of manufacturing a single crystal thin film which comprises vapor phase growth of a single crystal thin film on a semiconductor single crystal substrate placed on a holder for rotating on its own axis in a reactor vessel by feeding the source material gas to said semiconductor single crystal substrate:

wherein growth conditions are determined by conducting a vapor phase growth of a single crystal thin film on said semiconductor single crystal substrate without rotating said holder on its axis in the preparation stage before the manufacturing of said single crystal thin film; and then said single crystal thin film is manufactured based on said growth conditions.

2. The method of manufacturing a single crystal thin film of claim 1 wherein, in said preparation stage, the growth rate of the single crystal thin film is adjusted to be laterally asymmetric with respect to a virtual center axis on said holder parallel to the direction in which the source material gas is fed.

3. The method of manufacturing a single crystal thin film of claim 2 wherein a first growth rate measurement of said single crystal thin film and a second growth rate measurement of said single crystal thin film are taken at right and left ends of said semiconductor single crystal substrate along said virtual center axis and one of said first and second growth rate measurements is 1.3 to 1.8 times greater than the other of said first and second growth rate measurements.

* * * * *